(12) United States Patent
Jeong et al.

(10) Patent No.: US 12,272,428 B2
(45) Date of Patent: Apr. 8, 2025

(54) COMMAND ADDRESS CONTROL CIRCUIT AND SEMICONDUCTOR APPARATUS AND SEMICONDUCTOR SYSTEM INCLUDING THE COMMAND ADDRESS CONTROL CIRCUIT AND SEMICONDUCTOR APPARATUS

(71) Applicant: SK hynix Inc., Icheon-si (KR)

(72) Inventors: Se Ra Jeong, Icheon-si (KR); Kyung Hoon Kim, Icheon-si (KR); Ji Hwan Park, Icheon-si (KR); Ha Jun Jeong, Icheon-si (KR); Jae Hoon Cha, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 238 days.

(21) Appl. No.: 17/901,159

(22) Filed: Sep. 1, 2022

(65) Prior Publication Data
US 2023/0062952 A1 Mar. 2, 2023

Related U.S. Application Data

(60) Provisional application No. 63/240,292, filed on Sep. 2, 2021.

(30) Foreign Application Priority Data

Jul. 22, 2022 (KR) .................. 10-2022-0091308

(51) Int. Cl.
*G11C 8/18* (2006.01)
*G11C 8/06* (2006.01)
*G11C 29/52* (2006.01)

(52) U.S. Cl.
CPC .................. *G11C 8/18* (2013.01); *G11C 8/06* (2013.01); *G11C 29/52* (2013.01)

(58) Field of Classification Search
CPC .. G11C 8/18; G11C 8/06; G11C 29/52; G11C 7/109; G11C 7/1093; G11C 7/22; G11C 2029/0411; G11C 2207/2254
USPC ....................................... 365/233.1
See application file for complete search history.

(56) References Cited

U.S. PATENT DOCUMENTS

| 7,944,761 B2 | 5/2011 | Choi et al. |
| 10,474,593 B2 | 11/2019 | Kim et al. |
| 2001/0017368 A1* | 8/2001 | Rhee .................. G11C 7/1057 257/1 |

(Continued)

FOREIGN PATENT DOCUMENTS

| CN | 110580926 A | * 12/2019 | ............ G06F 11/076 |
| JP | 2003085970 A | * 3/2003 | ............ G11C 11/406 |
| JP | 3708714 B2 | * 10/2005 | .............. G06F 11/00 |

OTHER PUBLICATIONS

Wu (Year: 2019).*

(Continued)

*Primary Examiner* — Fernando Hidalgo
(74) *Attorney, Agent, or Firm* — WILLIAM PARK & ASSOCIATES LTD.

(57) ABSTRACT

A semiconductor apparatus includes a command address control circuit. The command address control circuit is configured to receive a row command address signal and a column command address signal, and is configured to selectively invert the row command address signal and the column command address signal based on a logic level of at least one bit of the row command address signal.

10 Claims, 3 Drawing Sheets

(56) References Cited

U.S. PATENT DOCUMENTS

| | | | |
|---|---|---|---|
| 2006/0002204 A1* | 1/2006 | Nam | G11C 29/787 |
| | | | 365/200 |
| 2011/0320867 A1* | 12/2011 | Chaudhuri | G06F 11/073 |
| | | | 714/15 |
| 2019/0198101 A1* | 6/2019 | Yoon | G11C 8/10 |
| 2021/0183460 A1* | 6/2021 | Bringivijayaraghavan | |
| | | | G11C 29/76 |
| 2021/0208801 A1* | 7/2021 | Song | G06F 3/0604 |

OTHER PUBLICATIONS

Hiroyuki (Year: 2003).*
JP 3708714 B2; all pages, 2005, Redundant Fuse Box and Semiconductor Device. (Year: 2005).*
Michael Litt, Proposed GDDR7 Command Truth Table, JC-42.1, Feb. 23, 2022, pp. 1-4, Committee Letter Ballot, Solid State Technology Association, Arlington, VA, USA.
Michael Litt, Proposed GDDR7 Command Truth Table, JC-42.1, Feb. 4, 2022, pp. 1-4, Committee Letter Ballot, Solid State Technology Association, Arlington, VA, USA.

* cited by examiner

FIG. 2A

| | WCK | CA<0> | CA<1> | CA<2> |
|---|---|---|---|---|
| ACT | 0 | H | CABI | V(R16) |
| | 1 | V(R15) | V(R15) | R13 |
| | 2 | BA3 | BA2 | BA1 |
| | 3 | BA0 | R12 | R11 |
| | 4 | R10 | R9 | R8 |
| | 5 | R7 | R6 | R5 |
| | 6 | R4 | R3 | R2 |
| | 7 | R1 | R0 | PAR |

| | WCK | CA<3> | CA<4> |
|---|---|---|---|
| WR | 0 | L | CABI |
| | 1 | H | BA3 |
| | 2 | BA2 | BA1 |
| | 3 | BA0 | V(C6) |
| | 4 | AP | C5 |
| | 5 | C4 | C3 |
| | 6 | C2 | C1 |
| | 7 | C0 | PAR |

FIG. 2B

| | WCK | CA<0> | CA<1> | CA<2> | CA<3> | CA<4> |
|---|---|---|---|---|---|---|
| ACT/WR | 0 | H | CABI | V(R16) | L | V(C6) |
| | 1 | V(R15) | V(R14) | R13 | H | BA3 |
| | 2 | BA3 | BA2 | BA1 | BA2 | BA1 |
| | 3 | BA0 | R12 | R11 | BA0 | PAR |
| ACT/WR | 4 | R10 | CABI | R8 | AP | C5 |
| | 5 | R7 | R6 | R5 | C4 | C3 |
| | 6 | R4 | R3 | R2 | C2 | C1 |
| | 7 | R1 | R0 | R9 | C0 | PAR |

COMMAND ADDRESS CONTROL CIRCUIT
AND SEMICONDUCTOR APPARATUS AND
SEMICONDUCTOR SYSTEM INCLUDING
THE COMMAND ADDRESS CONTROL
CIRCUIT AND SEMICONDUCTOR
APPARATUS

CROSS-REFERENCE TO RELATED
APPLICATIONS

The present application claims the benefit of U.S. Provisional Application No. 63/240,292, filed on Sep. 2, 2021, and claims priority under 35 U.S.C. § 119(a) to Korean Application No. 10-2022-0091308, filed on Jul. 22, 2022, which are incorporated herein by reference in its entirety as set forth in full.

BACKGROUND

1. Technical Field

Various embodiments generally relate to an integrated circuit technology, and, more particularly, to command address control circuit and semiconductor apparatus and semiconductor system using the command address control circuit and semiconductor apparatus.

2. Related Art

An electronic device includes a lot of electronic elements and a computer system as the electronic device includes lots of semiconductor apparatuses each configured by a semiconductor. The semiconductor apparatus configuring the computer system may include a processor or a memory controller and a memory device or a storage device. The processor or the memory controller may work as a master device and the memory device or storage device may work as a slave device. The master device may provide the slave device with a command address signal and the slave device may perform various operations in response to the command address signal. For example, in response to the command address signal, the slave device may perform an active operation, a read operation, a write operation and so forth. In synchronization with a clock signal, the master device may provide the slave device with the command address signal. As a semiconductor apparatus becomes integrated and increases in functionality, reduced more and more is a number of pins or pads that are configured to transfer (i.e., receive and transmit) the command address signal. Accordingly, in a recent semiconductor system, a set of command address signals are transferred through a limited number of pins or pads during a plurality of clock cycles.

SUMMARY

In an embodiment, a semiconductor apparatus may include a command address control circuit. The command address control circuit may be configured to receive a row command address signal and a column command address signal and may be configured to selectively invert the row command address signal and the column command address signal based on a logic level of at least one bit of the row command address signal.

In an embodiment, a semiconductor apparatus may include a command address control circuit. The command address control circuit may be configured to receive a row command address signal and a column command address signal and may be configured to correct an error of the row command address signal and the column command address signal based on at least one bit of the column command address signal.

In an embodiment, a semiconductor apparatus may include a command generating circuit. The command generating circuit may be configured to generate a row command address signal, which includes a bit including inversion information, and a column command address signal, which includes a bit including a parity, and may be configured to transmit the row command address signal and the column command address signal in synchronization with a clock signal.

In an embodiment, a semiconductor system may include a first semiconductor apparatus and a second semiconductor apparatus. The first semiconductor apparatus may be configured to generate a row command address signal, which includes a bit including inversion information, and a column command address signal, which includes a bit including a parity, and configured to transmit, as a command address signal set, the row command address signal and the column command address signal. The second semiconductor apparatus may be configured to receive the command address signal set, configured to selectively invert the command address signal set based on the bit including the inversion information, and configured to correct an error of the command address signal set based on the bit including the parity.

In an embodiment, a command address control circuit may include an inversion circuit, a row control circuit, and a column control circuit. The inversion circuit may be configured to receive a row command address signal and a column command address signal, and configured to selectively invert, based on a bit of the row command address signal, the row command address signal and the column command address signal to generate an internal row command address signal and an internal column command address signal. The row control circuit may be configured to generate a row command signal and a row address signal based on the internal row command address signal. The column control circuit may be configured to generate a column command signal and a column address signal based on the internal column command address signal.

In an embodiment, a command address control circuit may include an error correcting circuit, a row control circuit, and a column control circuit. The error correcting circuit may be configured to receive a row command address signal and a column command address signal, and configured to correct, based on a bit of the column command address signal, an error of the row command address signal and the column command address signal to generate an internal row command address signal and an internal column command address signal. The row control circuit may be configured to generate a row command signal and a row address signal based on the internal row command address signal. The column control circuit may be configured to generate a column command signal and a column address signal based on the internal column command address signal.

BRIEF DESCRIPTION OF THE DRAWINGS

FIG. 2A is a table illustrating a configuration of a command address signal according to a comparative example.

FIG. 2B is a table illustrating a configuration of a command address signal in accordance with an embodiment.

DETAILED DESCRIPTION

Figure 1:
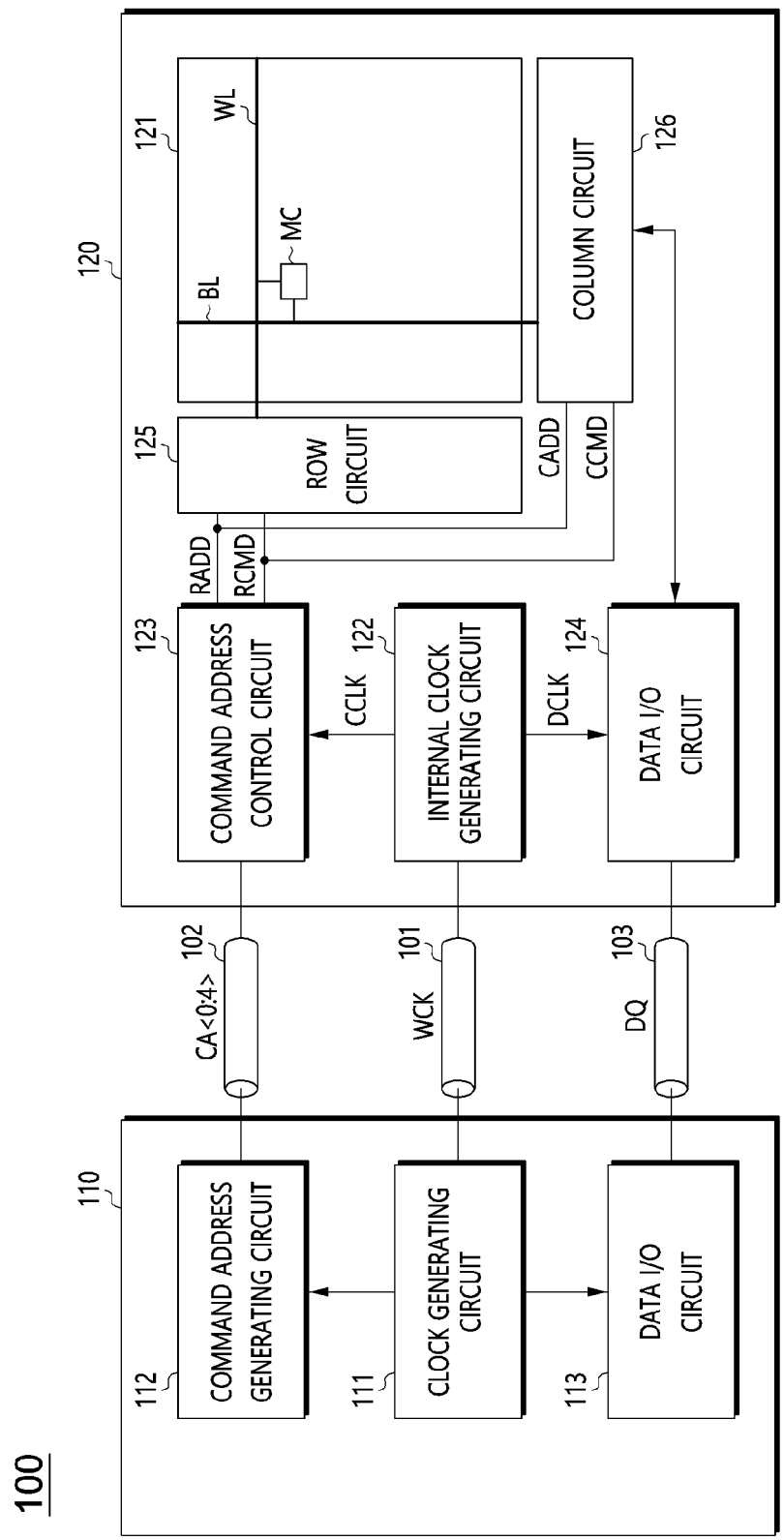
FIG. 1 is a diagram illustrating a configuration of a semiconductor system in accordance with an embodiment.

FIG. 1 is a diagram illustrating a configuration of a semiconductor system 100 in accordance with an embodiment. Referring to FIG. 1, the semiconductor system 100 may include a first semiconductor apparatus 110 and a second semiconductor apparatus 120. The first semiconductor apparatus 110 may provide various control signals using for the second semiconductor apparatus 120 to operate. The first semiconductor apparatus 110 may include various types of devices. For example, the first semiconductor apparatus 110 may be a host device such as a central processing unit (CPU), a graphic processing unit (GPU), a multi-media processor (MMP), a digital signal processor, an application processor (AP) and a memory controller. For example, the second semiconductor apparatus 120 may be a memory device and the memory device may include a volatile memory and a non-volatile memory. The volatile memory may include a static random access memory (static RAM: SRAM), a dynamic RAM (DRAM) and a synchronous DRAM (SDRAM). The non-volatile memory may include a read only memory (ROM), a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM), a ferroelectric RAM (FRAM) and so forth.

The second semiconductor apparatus 120 may be coupled to the first semiconductor apparatus 110 through a plurality of buses. Each of the buses may be a signal transmission path, a link, or a channel for transferring a signal. The plurality of buses may include a clock bus 101, a command address bus 102 and a data bus 103. Each of the clock bus 101 and the command address bus 102 may be a unidirectional bus from the first semiconductor apparatus 110 to the second semiconductor apparatus 120. The data bus 103 may be a bidirectional bus between the first semiconductor apparatus 110 and the second semiconductor apparatus 120. The second semiconductor apparatus 120 may be coupled to the first semiconductor apparatus 110 through the clock bus 101 and may receive a clock signal WCK from the first semiconductor apparatus 110 through the clock bus 101. The clock signal WCK may include one or more clock signal pairs. The second semiconductor apparatus 120 may be coupled to the first semiconductor apparatus 110 through the command address bus 102 and may receive a command address signal CA<0:4> from the first semiconductor apparatus 110 through the command address bus 102. The command address signal CA<0:4> may include a plurality of bits. Based on the clock signal WCK, the second semiconductor apparatus 120 may receive the command address signal CA<0:4>. The second semiconductor apparatus 120 may be coupled to the first semiconductor apparatus 110 through the data bus 103. Through the data bus 103, the second semiconductor apparatus 120 may receive data DQ from the first semiconductor apparatus 110 and may transmit the data DQ to the first semiconductor apparatus 110. A data input operation and/or a write operation may be defined as an operation of transferring the data DQ from the first semiconductor apparatus 110 to the second semiconductor apparatus 120. A data output operation and/or a read operation may be defined as an operation of transferring the data DQ from the second semiconductor apparatus 120 to the first semiconductor apparatus 110.

The first semiconductor apparatus 110 may include a clock generating circuit 111, a command address generating circuit 112, and a data input/output circuit 113. The clock generating circuit 111 may generate the clock signal WCK and may transmit the clock signal WCK to the second semiconductor apparatus 120 through the clock bus 101. The clock generating circuit 111 may provide the clock signal WCK to the command address generating circuit 112 and the data input/output circuit 113. The clock generating circuit 111 may generate the clock signal WCK having a frequency corresponding to the operating speed of the semiconductor system 100. In an embodiment, the clock generating circuit 111 may generate the clock signal WCK having a lower or higher frequency than the frequency corresponding to the operating speed of the semiconductor system 100. In order to generate the clock signal WCK, the clock generating circuit 111 may include at least one of various clock generators such as ring oscillator, delay locked loop circuit, and phase locked loop circuit. In an embodiment, the clock generating circuit 111 may adjust frequency and/or phase of the clock signal WCK and may provide the command address generating circuit 112 and/or the data input/output circuit 113 with the clock signal WCK, the frequency and/or phase of which is adjusted.

The command address generating circuit 112 may generate a command address signal set based on a request REQ. The command address generating circuit 112 may generate command address signal sets each including different information based on various requests REQ. In order to transmit the command address signal set, the command address generating circuit 112 may transmit, during a plurality of cycles, the command address signal CA<0:4> to the second semiconductor apparatus 120 through the command address bus 102. Although the command address bus 102 is shown as configured to transfer the command address signal CA<0:4> of five bits, the number of bits of the command address signal CA<0:4> may be variously changed or modified. The command address signal set may include a row command address signal and a column command address signal. The row command address signal may be utilized by the second semiconductor apparatus 120 when generating a row command signal RCMD and a row address signal RADD. The column command address signal may be utilized by the second semiconductor apparatus 120 when generating a column command signal CCMD and a column address signal CADD.

The command address generating circuit 112 may receive the clock signal WCK from the clock generating circuit 111. In synchronization with the clock signal WCK, the command address generating circuit 112 may output the command address signal CA<0:4> to the command address bus 102. During one or more unit cycles, the command address generating circuit 112 may provide the command address bus 102 with the command address signal set, which includes the row command address signal and the column command address signal. For example, the unit cycle may correspond to four cycles of the clock signal WCK. Each of the row command address signal and the column command address signal may be of two types. First-type row command address signal and first-type column command address signal may be the command address signal set to be transferred during four cycles of the clock signal WCK. Second-type row command address signal and second-type column command address signal may be the command address signal set to be transferred during eight cycles of the clock signal WCK. For example, the command address signal CA<0:4> of five bits may be transferred through the command address bus 102 during a single cycle of the clock signal WCK. Within the command address signal CA<0:4>, three bits CA<0:2> may be allocated for the row command address signal and remaining two bits CA<3:4> may be allocated for the column command address signal. Therefore, the first-type row command address signal may include twelve bits in total and the second-type row command address signal may include twenty-four bits in total. Also, the first-type column command address signal may include eight bits in total and the second-type column command address signal may include sixteen bits in total.

When the row command address signal or column command address signal is of the first type according to the request REQ, the command address generating circuit 112 may transmit the row command address signal or column command address signal by transmitting the command address signal CA<0:4> during four cycles of the clock signal WCK. When the row command address signal or column command address signal is of the second type according to the request REQ, the command address generating circuit 112 may transmit the row command address signal or column command address signal by transmitting the command address signal CA<0:4> during eight cycles of the clock signal WCK. At least one bit of the row command address signal that is transferred during the unit cycle may include inversion information to be utilized for an inversion operation on the row command address signal and the column command address signal that is transferred during the unit cycle. At least one bit of the column command address signal that is transferred during the unit cycle may include a parity to be utilized for detecting and correcting an error in the row command address signal and column command address signal that is transferred during the unit cycle.

The data input/output circuit 113 may be coupled to the second semiconductor apparatus 120 through the data bus 103 and may transmit and receive the data DQ through the data bus 103. The data input/output circuit 113 may receive the clock signal WCK from the clock generating circuit 111. During the write operation, the data input/output circuit 113 may output, as the data DQ, internal data of the first semiconductor apparatus 110 through the data bus 103 based on the clock signal WCK. During the read operation, the data input/output circuit 113 may receive, based on the clock signal WCK, the data DQ transferred through the data bus 103 and may generate internal data of the first semiconductor apparatus 110 based on the data DQ.

The second semiconductor apparatus may include a memory cell array 121, an internal clock generating circuit 122, a command address control circuit 123, and a data input/output circuit 124. Although not illustrated, the memory cell array 121 may include a plurality of memory banks. In each of the plurality of memory banks, a plurality of word lines WL may be disposed in a row direction and a plurality of bit lines BL may be disposed in a column direction. A plurality of memory cells MC may be coupled to the cross-sections of the plurality of word lines WL and the plurality of bit lines BL. When one of the plurality of word lines WL is selected according to the row address signal RADD and one of the plurality of bit lines BL is selected according to the column address signal CADD, accessed may be a target memory cell coupled between the selected word line and the selected bit line.

The internal clock generating circuit 122 may be coupled to the first semiconductor apparatus 110 through the clock bus 101 and may receive, through the clock bus 101, the clock signal WCK transferred from the first semiconductor apparatus 110. The internal clock generating circuit 122 may generate a plurality of internal clock signals based on the clock signal WCK. The internal clock generating circuit 122 may provide the plurality of internal clock signals to the command address control circuit 123 and the data input/output circuit 124 for the command address control circuit 123 and the data input/output circuit 124 to operate based on the clock signal WCK. The internal clock generating circuit 122 may generate the plurality of internal clock signals having various frequencies and/or phases. Based on the clock signal WCK, the internal clock generating circuit 122 may generate a command clock signal CCLK and a data clock signal DCLK. The internal clock generating circuit 122 may generate the command clock signal CCLK and the data clock signal DCLK by adjusting the frequency and/or phase of the clock signal WCK. In order to adjust the frequency and/or phase of the clock signal WCK, the internal clock generating circuit 122 may include frequency divider, frequency multiplier, delay locked loop circuit, and so forth.

The command address control circuit 123 may be coupled to the first semiconductor apparatus 110 through the command address bus 102 and may receive, through the command address bus 102, the command address signal CA<0:4> transferred from the first semiconductor apparatus 110. The command address control circuit 123 may receive the internal clock signal from the internal clock generating circuit 122. In synchronization with the command clock signal CCLK, the command address control circuit 123 may receive the command address signal CA<0:4>. Based on the row command address signal included in the command address signal CA<0:4>, the command address control circuit 123 may generate the row command signal RCMD and the row address signal RADD. For example, but not limited, the row command signal RCMD may include active signal, precharge signal, refresh signal, and so forth. The row command signal RCMD may include a first-type row command signal and a second-type row command signal. The first-type row command signal may be a row command signal generated based on the first-type row command address signal. The second-type row command signal may be a row command signal generated based on the second-type row command address signal. Based on the column command address signal included in the command address signal CA<0:4>, the command address control circuit 123 may generate the column command signal CCMD and the column address signal CADD. For example, but not limited, the column command signal CCMD may include read signal, write signal, read training signal, write training signal, and so forth. The column command signal CCMD may include a first-type column command signal and a second-type column command signal. The first-type column command signal may be a column command signal generated based on the first-type column command address signal. The second-type column command signal may be a column command signal generated based on the second-type column command address signal. Based on specific bits included in the command address signal CA<0:4>, the command address control circuit 123 may perform an inversion operation and/or an error correcting operation. By receiving the command address signal CA<0:4> during the unit cycle, the command address control circuit 123 may receive, for each unit cycle and through the command address bus 102, the command address signal set including the row command address signal and the column command address signal.

Based on at least one bit included in the row command address signal that is received during the unit cycle, the command address control circuit 123 may selectively invert the row command address signal and the column command address signal. Based on at least one bit included in the column command address signal that is received during the unit cycle, the command address control circuit 123 may correct an error of the row command address signal and the column command address signal.

The data input/output circuit 124 may be coupled to the first semiconductor apparatus 110 through the data bus 103. Through the data bus 103, the data input/output circuit 124 may transmit the data DQ to the first semiconductor apparatus 110 and may receive the data DQ transmitted from the first semiconductor apparatus 110. The data input/output circuit 124 may receive the internal clock signal from the internal clock generating circuit 122. In synchronization with the data clock signal DCLK, the data input/output circuit 124 may receive the data DQ transmitted from the first semiconductor apparatus 110. In synchronization with the data clock signal DCLK, the data input/output circuit 124 may transmit the data DQ to the first semiconductor apparatus 110. During the write operation, the data input/output circuit 124 may receive the data DQ from the first semiconductor apparatus 110 to generate internal data of the first semiconductor apparatus 110 and may provide the memory cell array 121 with the internal data. During the read operation, the data input/output circuit 124 may receive the internal data output from the memory cell array 121 and may transmit the internal data as the data DQ to the first semiconductor apparatus 110.

The second semiconductor apparatus 120 may further include a row circuit 125 and a column circuit 126. When an active signal is enabled among the row command signal RCMD, the row circuit 125 may select a particular word line based on the row address signal RADD to access a target memory cell among the plurality of memory cells. When read signal and write signal are enabled among the column command signal CCMD, the column circuit 126 may select a particular bit line based on the column address signal CADD to access a target memory cell among the plurality of memory cells. During the read operation, in response to the read signal, the column circuit 126 may read the internal data stored in the target memory cell coupled between the selected word line and bit line and may output the internal data to the data input/output circuit 124. During the write operation, in response to the write signal, the column circuit 126 may receive the internal data from the data input/output circuit 124 and may write the internal data into the target memory cell coupled between the selected word line and bit line.

FIG. 2A is a table illustrating a configuration of a command address signal CA<0:4> according to a comparative example. FIG. 2B is a table illustrating a configuration of a command address signal CA<0:4> in accordance with an embodiment. FIGS. 2A and 2B illustrate representatively the second-type row command address signal and second-type column command address signal. The second-type row command address signal may be shown to be generated as an active signal ACT among the row command signals. The second-type column command address signal may be shown to be generated as a write signal WR among the column command signals. The second-type row command address signal may include command information H or L, bank address information BA0, BA1, BA2, and BA3 and row address information R0, R1, R2, R3, R4, R5, R6, R7, R8, R9, R10, R11, R12, R13 V(R16), V(R15), and V(R14) that are to be utilized for generating row command signal and row address signal. The second-type column command address signal may include command information H, L, and AP, bank address information BA0, BA1, BA2, BA3 and column address information C0, C1, C2, C3, C4, C5, V(C6) that are to be utilized for generating column command signal and column address signal.

Referring to FIG. 2A, each of the row command address signal and the column command address signal may independently include inversion information CABI and a parity bit PAR. In other words, the row command address signal, that is generated from the command address signal CA<0:2> transferred during eight cycles WCK0 to WCK7 of the clock signal WCK, may include at least one bit CABI for selectively inverting the row command address signal and at least one bit PAR for detecting and correcting an error of the row command address signal. The column command address signal, that is generated from the command address signal CA<3:4> transferred during eight cycles WCK0 to WCK7 of the clock signal WCK, may include at least one bit CABI for selectively inverting the column command address signal and at least one bit PAR for detecting and correcting an error of the column command address signal. For example, the second bit CA<1> of the row command address signal that is transferred during the first cycle WCK0 may include inversion information CABI for selectively inverting the row command address signal that is transferred during the first to eighth cycles WCK0 toWCK7. The third bit CA<2> of the row command address signal that is transferred during the eighth cycle WCK7 may be the parity bit PAR for detecting and correcting an error of the row command address signal that is transferred during the first to eighth cycles WCK0 to WCK7. For example, the second bit CA<4> of the column command address signal that is transferred during the first cycle WCK0 may include inversion information CABI for selectively inverting the column command address signal that is transferred during the first to eighth cycles WCK0 to WCK7. The second bit CA<4> of the column command address signal that is transferred during the eighth cycle WCK7 may be the parity bit PAR for detecting and correcting an error of the column command address signal that is transferred during the first to eighth cycles WCK0 to WCK7. According to the prior art as described above, when each of the row command address signal and column command address signal independently includes bits for the inversion operation and error-correcting operation, circuits for receiving the command address signal may be more complicated and may have disadvantages against a high-speed operation.

In accordance with an embodiment, the command address signal may be configured as follows. Referring to FIG. 2B, in accordance with an embodiment, the command address signal set that is transferred during a signal unit cycle may include bits for the inversion operation and error-correcting operation. The row command address signal that is transferred during a single unit cycle may include one bit including the inversion information CABI for the inversion operation. The column command address signal that is transferred during a single unit cycle may include one bit corresponding to the parity bit PAR for the error-correcting operation. For example, the second bit CA<1> of the row command address signal that is transferred during the first cycle WCK0 may include inversion information CABI for selectively inverting the row command address signal and column command address signal, which are transferred during the first to fourth cycle WCK0 to WCK3. The second bit CA<4> of the column command address signal that is transferred during the fourth cycle WCK3 may be the parity bit PAR for detecting and correcting an error of the row command address signal and column command address signal, which are transferred during the first to fourth cycle WCK0 to WCK3. The second bit CA<1> of the row command address signal that is transferred during the fifth cycle WCK4 may include inversion information CABI for selectively inverting the row command address signal and column command address signal, which are transferred during the fifth to eighth cycle WCK4 to WCK7. The second bit CA<5> of the column command address signal that is transferred during the eighth cycle WCK7 may be the parity bit PAR for detecting and correcting an error of the row command address signal and column command address signal, which are transferred during the fifth to eighth cycle WCK4 to WCK7. When comparing the embodiment and the comparative example with each other, the row command address signal in accordance with the embodiment might not include the parity bit PAR for the error-correcting operation and therefore the second bit CA<1> of the row command address signal that is transferred during the fifth cycle WCK4 according to the comparative example may be embodied as the third bit CA<2> of the row command signal that is transferred during the eighth cycle WCK7 in accordance with the embodiment. Also, the column command address signal in accordance with the embodiment might not include the inversion information CABI for the inversion operation and therefore the second bit CA<4> of the column command address signal that is transferred during the fourth cycle WCK3 according to the comparative example may be embodied as the second bit CA<4> of the column command address signal that is transferred during the first cycle WCK0 in accordance with the embodiment.

Figure 3:
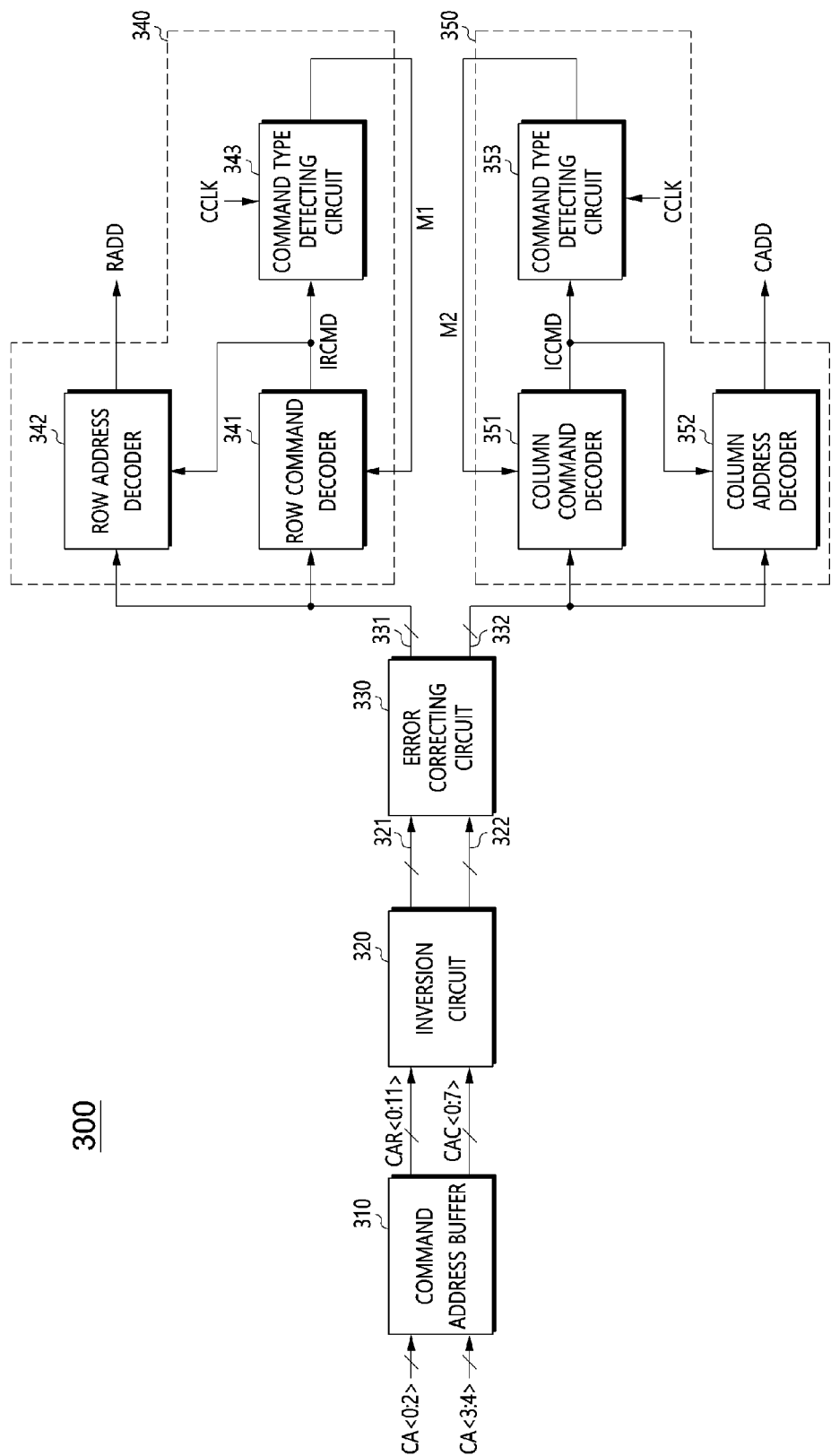
FIG. 3 is a diagram illustrating a configuration of a command address control circuit in accordance with an embodiment.

FIG. 3 is a diagram illustrating a configuration of a command address control circuit 300 in accordance with an embodiment. The command address control circuit 300 may be applied as the command address control circuit 123 illustrated in FIG. 1. Referring to FIG. 3, the command address control circuit 300 may receive the command address signal CA<0:2> and CA<3:4>. The command address control circuit 300 may receive the row command address signal CAR<0:11> and the column command address signal CAC<0:7> by receiving the command address signal CA<0:2> and CA<3:4> during the unit cycle. Based on a logic level of at least one bit of the row command address signal CAR<0:11>, the command address control circuit 300 may selectively invert the row command address signal CAR<0:11> and the column command address signal CAC<0:7>. Based on at least one bit of the column command address signal CAC<0:7>, the command address control circuit 300 may detect and correct an error of the row command address signal CAR<0:11> and the column command address signal CAC<0:7>. The command address control circuit 300 may generate the row command signal RCMD and the row address signal RADD based on the row command address signal CAR<0:11> and may generate the column command signal CCMD and the column address signal CADD based on the column command address signal CAC<0:7>.

The command address control circuit 300 may include a command address buffer 310, an inversion circuit 320, an error correcting circuit 330, a row control circuit 340, and a column control circuit 350. The command address buffer 310 may receive the command address signal CA<0:4>. The command address buffer 310 may receive the command address signal CA<0:4> to generate the row command address signal CAR<0:11> and the column command address signal CAC<0:7>. The command address buffer 310 may receive the command address set by receiving the command address signal CA<0:4> during the unit cycle. The command address buffer 310 may latch the command address signal CA<0:4>, which is received during the unit cycle, to generate the command address signal set. The command address signal set may include the row command address signal CAR<0:11> and the column command address signal CAC<0:7>.

The inversion circuit 320 may receive the row command address signal CAR<0:11> and the column command address signal CAC<0:7> from the command address buffer 310. Based on at least one bit of the row command address signal CAR<0:11>, the inversion circuit 320 may selectively invert the row command address signal CAR<0:11> and the column command address signal CAC<0:7>. When at least one bit of the row command address signal CAR<0:11> is at a first logic level, the inversion circuit 320 may invert logic levels of the row command address signal CAR<0:11> and the column command address signal CAC<0:7>. When at least one bit of the row command address signal CAR<0:11> is at a second logic level, the inversion circuit 320 may non-invert (i.e., not invert) logic levels of the row command address signal CAR<0:11> and the column command address signal CAC<0:7>. The inversion circuit 320 may selectively invert the row command address signal CAR<0:11> to generate an inverted row command address signal 321 and may selectively invert the column command address signal CAC<0:7> to generate an inverted column command address signal 322.

The error correcting circuit 330 may detect and correct an error of the row command address signal CAR<0:11> and the column command address signal CAC<0:7>. The error correcting circuit 330 may be coupled to the inversion circuit 320 and may receive the inverted row command address signal 321 and the inverted column command address signal 322 from the inversion circuit 320. The error correcting circuit 330 may detect and correct an error of the inverted row command address signal 321 and the inverted column command address signal 322. Based on at least one bit within the inverted column command address signal 322, the error correcting circuit 330 may detect and correct an error of the inverted row command address signal 321 and the inverted column command address signal 322 to generate an internal row command address signal 331 and an internal column command address signal 332.

In an embodiment, the error correcting circuit 330 may be coupled between the command address buffer 310 and the inversion circuit 320. As such, the error correcting circuit 330 may receive the row command address signal CAR<0:11> and the column command address signal CAC<0:7>. Based on at least one bit of the column command address signal CAC<0:7>, the error correcting circuit 330 may detect and correct an error of the row command address signal CAR<0:11> and the column command address signal CAC<0:7> to provide the inversion circuit 320 with the error-corrected row command address signal CAR<0:11> and column command address signal CAC<0:7>. The inversion circuit 320 may receive the error-corrected row command address signal CAR<0:11> and column command address signal CAC<0:7> from the error correcting circuit 330. Based on at least one bit within the error-corrected row command address signal CAR<0:11>, the inversion circuit 320 may selectively invert the error-corrected row command address signal CAR<0:11> and column command address signal CAC<0:7> to generate the internal row command address signal 331 and the internal column command address signal 332. In an embodiment, the command address control circuit 300 may include any one of the inversion circuit 320 and the error correcting circuit 330. When the command address control circuit 300 does not include the error correcting circuit 330, i.e., when the command address control circuit 300 includes only the inversion circuit 320, the inversion circuit 320 may receive the row command address signal CAR<0:11> and the column command address signal CAC<0:7>. In this case, based on at least one bit of the row command address signal CAR<0:11>, the inversion circuit 320 may selectively invert the row command address signal CAR<0:11> and the column command address signal CAC<0:7> to generate the internal row command address signal 331 and the internal column command address signal 332. When the command address control circuit 300 does not include the inversion circuit 320, i.e., when the command address control circuit 300 includes only the error correcting circuit 330, the error correcting circuit 330 may receive the row command address signal CAR<0:11> and the column command address signal CAC<0:7>. In this case, based on at least one bit of the column command address signal CAC<0:7>, the error correcting circuit 330 may detect and correct an error of the row command address signal CAR<0:11> and the column command address signal CAC<0:7> to generate the internal row command address signal 331 and the internal column command address signal 332.

The row control circuit 340 may receive the internal row command address signal 331 from the error correcting circuit 330 and may generate the row command signal RCMD and the row address signal RADD from the internal row command address signal 331. The row control circuit 340 may generate the row command signal RCMD based on the internal row command address signal 331 generated from the row command address signal CAR<0:11> that is received during a current unit cycle. The row control circuit 340 may detect the type of the row command signal RCMD. According to the type of the row command signal RCMD, the row control circuit 340 may generate one of the row command signal RCMD and the row address signal RADD based on the internal row command address signal 331 generated from the row command address signal CAR<0:11> that is received during a subsequent unit cycle. For example, when the row command signal RCMD generated based on the row command address signal CAR<0:11> that is received during a current unit cycle is of the first type, the row control circuit 340 may generate the row command signal RCMD based on the row command address signal CAR<0:11> that is received during a subsequent unit cycle. For example, when the row command signal RCMD generated based on the row command address signal CAR<0:11> that is received during a current unit cycle is of the second type, the row control circuit 340 may generate the row address signal RADD based on the row command address signal CAR<0:11> that is received during a subsequent unit cycle.

The column control circuit 350 may receive the internal column command address signal 332 from the error correcting circuit 330 and may generate the column command signal CCMD and the column address signal CADD from the internal column command address signal 332. The column control circuit 350 may generate the column command signal CCMD based on the internal column command address signal 332 generated from the column command address signal CAC<0:7> that is received during a current unit cycle. The column control circuit 350 may detect the type of the column command signal CCMD. According to the type of the column command signal CCMD, the column control circuit 350 may generate one of the column command signal CCMD and the column address signal CADD based on the internal column command address signal 332 generated from the column command address signal CAC<0:7> that is received during a subsequent unit cycle. For example, when the column command signal CCMD generated based on the column command address signal CAC<0:7> that is received during a current unit cycle is of the first type, the column control circuit 350 may generate the column command signal CCMD based on the column command address signal CAC<0:7> that is received during a subsequent unit cycle. For example, when the column command signal CCMD generated based on the column command address signal CAC<0:7> that is received during a current unit cycle is of the second type, the column control circuit 350 may generate the column address signal CADD based on the column command address signal CAC<0:7> that is received during a subsequent unit cycle.

The row control circuit 340 may include a row command decoder 341, a row address decoder 342, and a first command type detecting circuit 343. The row command decoder 341 may receive the internal row command address signal 331. The row command decoder 341 may decode the internal row command address signal 331 to generate the row command signal RCMD. The row command decoder 341 may receive a first mask signal M1. The row command decoder 341 may be selectively activated on the basis of the first mask signal M1. For example, the row command decoder 341 may be activated when the first mask signal M1 becomes disabled and may be deactivated when the first mask signal M1 becomes enabled. When activated, the row command decoder 341 may decode the internal row command address signal 331 to generate the row command signal RCMD. When deactivated, the row command decoder 341 might not decode the internal row command address signal 331 to not generate the row command signal RCMD.

The row address decoder 342 may receive the internal row command address signal 331. The row address decoder 342 may generate the row address signal RADD based on the internal row command address signal 331. The row address decoder 342 may receive the row command signal RCMD from the row command decoder 341. The row address decoder 342 may generate the row address signal RADD by decoding the internal row command address signal 331 based on the row command signal RCMD. When the row command signal RCMD is of the second type, the row address decoder 342 may decode the internal row command address signal 331 to generate the row address signal RADD. When the row command signal RCMD is of the first type, the row address decoder 342 might not decode the internal row command address signal 331 to not generate the row address signal RADD.

The first command type detecting circuit 343 may receive the row command signal RCMD from the row command decoder 341. The first command type detecting circuit 343 may detect the type of the row command signal RCMD. According to the type of the row command signal RCMD, the first command type detecting circuit 343 may generate the first mask signal M1. The first command type detecting circuit 343 may keep the first mask signal M1 disabled when the row command signal RCMD is of the first type. The first command type detecting circuit 343 may enable the first mask signal M1 when the row command signal RCMD is of the second type. The first command type detecting circuit 343 may receive the command clock signal CCLK illustrated in FIG. 1 and may operate in synchronization with the command clock signal CCLK. In synchronization with the command clock signal CCLK, the first command type detecting circuit 343 may keep or change the logic level of the first mask signal M1 according to the type of the row command signal RCMD at each unit cycle.

The column control circuit 350 may include a column command decoder 351, a column address decoder 352, and a second command type detecting circuit 353. The column command decoder 351 may receive the internal column command address signal 332. The column command decoder 351 may decode the internal column command address signal 332 to generate the column command signal CCMD. The column command decoder 351 may receive a second mask signal M2. The column command decoder 351 may be selectively activated on the basis of the second mask signal M2. For example, the column command decoder 351 may be activated when the second mask signal M2 becomes disabled and may be deactivated when the second mask signal M2 becomes enabled. When activated, the column command decoder 351 may decode the internal column command address signal 332 to generate the column command signal CCMD. When deactivated, the column command decoder 351 might not decode the internal column command address signal 332 to not generate the column command signal CCMD.

The column address decoder 352 may receive the internal column command address signal 332. The column address decoder 352 may generate the column address signal CADD based on the internal column command address signal 332. The column address decoder 352 may receive the column command signal CCMD from the column command decoder 351. The column address decoder 352 may generate the column address signal CADD by decoding the internal column command address signal 332 based on the column command signal CCMD. When the column command signal CCMD is of the second type, the column address decoder 352 may decode the internal column command address signal 332 to generate the column address signal CADD. When the column command signal CCMD is of the first type, the column address decoder 352 might not decode the internal column command address signal 332 to not generate the column address signal CADD.

The second command type detecting circuit 353 may receive the column command signal CCMD from the column command decoder 351. The second command type detecting circuit 353 may detect the type of the column command signal CCMD. According to the type of the column command signal CCMD, the second command type detecting circuit 353 may generate the second mask signal M2. The second command type detecting circuit 353 may keep the second mask signal M2 disabled when the column command signal CCMD is of the first type. The second command type detecting circuit 353 may enable the second mask signal M2 when the column command signal CCMD is of the second type. The second command type detecting circuit 353 may receive the command clock signal CCLK illustrated in FIG. 1 and may operate in synchronization with the command clock signal CCLK. In synchronization with the command clock signal CCLK, the second command type detecting circuit 353 may keep or change the logic level of the second mask signal M2 according to the type of the column command signal CCMD at each unit cycle.

While certain embodiments have been described above, it will be understood to those skilled in the art that the embodiments described are by way of example only. Accordingly, the command address control circuit, semiconductor apparatus and semiconductor system including the same should not be limited based on the described embodiments. Rather, the command address control circuit, semiconductor apparatus and semiconductor system including the same described herein should only be limited in light of the claims that follow when taken in conjunction with the above description and accompanying drawings.

What is claimed is:

1. A semiconductor apparatus comprising a command address control circuit configured to:
   receive a row command address signal and a column command address signal, and
   invert all bits of the row command address signal and the column command address signal when at least one bit within the row command address signal is at a first logic level, and non-invert all bits of the row command address signal and the column command address signal when the at least one bit within the row command address signal is at a second logic level.

2. The semiconductor apparatus of claim 1, wherein the command address control circuit is configured to receive the row command address signal and the column command address signal by receiving a command address signal during a plurality of cycles of a clock signal.

3. The semiconductor apparatus of claim 1, wherein the command address control circuit is configured to correct an error of the row command address signal and the column command address signal based on at least one bit of the column command address signal.

4. A semiconductor apparatus comprising a command generating circuit configured to:
   generate a row command address signal and a column command address signal, wherein the row command address signal comprises one bit that includes inversion information for selectively inverting the row command address signal and the column command address signal, and the column command address signal comprises one bit that includes a parity for detecting and correcting an error of the row command address signal and the column command address signal, and
   transmit the row command address signal and the column command address signal in synchronization with a clock signal.

5. The semiconductor apparatus of claim 4, wherein the command generating circuit is configured to transmit the row command address signal and the column command address signal by transmitting a command address signal during a plurality of cycles of the clock signal.

6. A command address control circuit comprising:
   an inversion circuit configured to:
   receive a row command address signal and a column command address signal, and
   invert all bits of the row command address signal and the column command address signal to generate an internal row command address signal and an internal column command address signal when at least one bit within the row command address signal is at a first logic level, and non-invert all bits of the row command address signal and the column command address signal to generate the internal row command address signal and the internal column command address signal when the at least one bit within the row command address signal is at a second logic level;
   a row control circuit configured to generate a row command signal and a row address signal based on the internal row command address signal; and a column control circuit configured to generate a column command signal and a column address signal based on the internal column command address signal.

7. The command address control circuit of claim 6, wherein the inversion circuit inverts, when the one bit is at the first logic level, all bits of the row command address signal and the column command address signal to generate the internal row command address signal and the internal column command address signal, and the inversion circuit non-inverts, when the one bit is at the second logic level, all bits of the row command address signal and the column command address signal to generate the internal row command address signal and the internal column command address signal.

8. The command address control circuit of claim 6, wherein the row control circuit comprises:
   a row command decoder configured to be selectively activated based on a first mask signal and configured to decode the internal row command address signal to generate the row command signal;
   a row address decoder configured to generate the row address signal from the internal row command address signal based on the row command signal; and
   a first command type detecting circuit configured to detect whether the row command signal is of a first type or a second type to generate the first mask signal.

9. The command address control circuit of claim 8, wherein the column control circuit comprises:
   a column command decoder configured to be selectively activated based on a second mask signal and configured to decode the internal column command address signal to generate the column command signal;
   a column address decoder configured to generate the column address signal from the internal column command address signal based on the column command signal; and
   a second command type detecting circuit configured to detect whether the column command signal is of a first type or a second type to generate the second mask signal.

10. The command address control circuit of claim 6, further comprising an error correcting circuit configured to correct an error of the row command address signal and the column command address signal based on one bit of the column command address signal.

\* \* \* \* \*